(12) United States Patent
Wan et al.

(10) Patent No.: US 11,837,519 B2
(45) Date of Patent: Dec. 5, 2023

(54) HEATSINK CUTOUT AND INSULATING THROUGH SILICON VIAS TO CUT THERMAL CROSS-TALK

(71) Applicant: Intel Corporation, Santa Clara, CA (US)

(72) Inventors: Zhimin Wan, Portland, OR (US);
Chia-Pin Chiu, Tempe, AZ (US);
Chandra Mohan Jha, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 789 days.

(21) Appl. No.: 16/783,819

(22) Filed: Feb. 6, 2020

(65) Prior Publication Data
US 2021/0249324 A1    Aug. 12, 2021

(51) Int. Cl.
| | |
|---|---|
| *H01L 23/15* | (2006.01) |
| *H01L 23/367* | (2006.01) |
| *H01L 25/065* | (2023.01) |
| *H01L 23/538* | (2006.01) |
| *H01L 23/498* | (2006.01) |
| *H01L 23/00* | (2006.01) |

(52) U.S. Cl.
CPC ........ *H01L 23/367* (2013.01); *H01L 23/5386* (2013.01); *H01L 25/0652* (2013.01); *H01L 23/49816* (2013.01); *H01L 23/5384* (2013.01); *H01L 24/16* (2013.01); *H01L 2224/16221* (2013.01)

(58) Field of Classification Search
CPC ....... H01L 2224/16221; H01L 23/5384; H01L 23/4981; H01L 25/0652; H01L 23/5386; H01L 23/367
See application file for complete search history.

(56) References Cited

U.S. PATENT DOCUMENTS

| | | | | |
|---|---|---|---|---|
| 6,114,761 | A * | 9/2000 | Mertol | H01L 23/367 257/722 |
| 6,519,154 | B1 * | 2/2003 | Chiu | H01L 23/50 257/E23.079 |
| 2006/0170094 | A1 * | 8/2006 | Subramanian | H01L 25/0655 257/E21.503 |
| 2018/0211900 | A1 * | 7/2018 | Gutala | G11C 7/04 |
| 2020/0051894 | A1 * | 2/2020 | Wan | H01L 23/427 |
| 2020/0350229 | A1 * | 11/2020 | Chang | H01L 23/3733 |

* cited by examiner

*Primary Examiner* — Hoa B Trinh
(74) *Attorney, Agent, or Firm* — Schwabe, Williamson & Wyatt, P.C.

(57) ABSTRACT

Embodiments disclosed herein include electronic packages. In an embodiment, the electronic package comprises an interposer, a first die attached to the interposer, and a second die attached to the interposer. In an embodiment, the electronic package further comprises a heatsink thermally coupled to the first die and the second die. In an embodiment, the heatsink has a first surface facing away from the first die and the second die and a second surface facing the first die and the second die. In an embodiment, the heatsink comprises a thermal break between the first die and the second die.

25 Claims, 11 Drawing Sheets

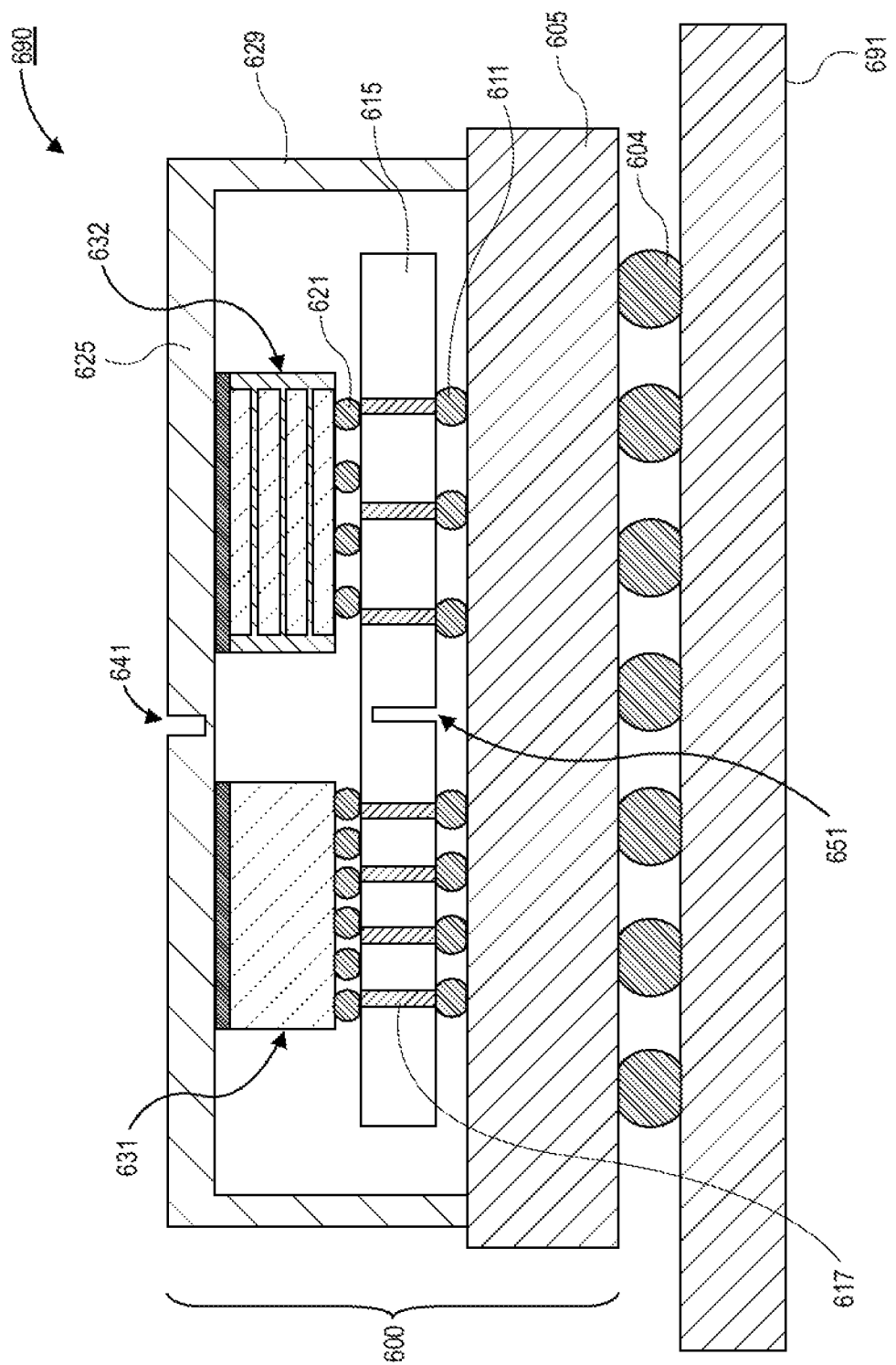

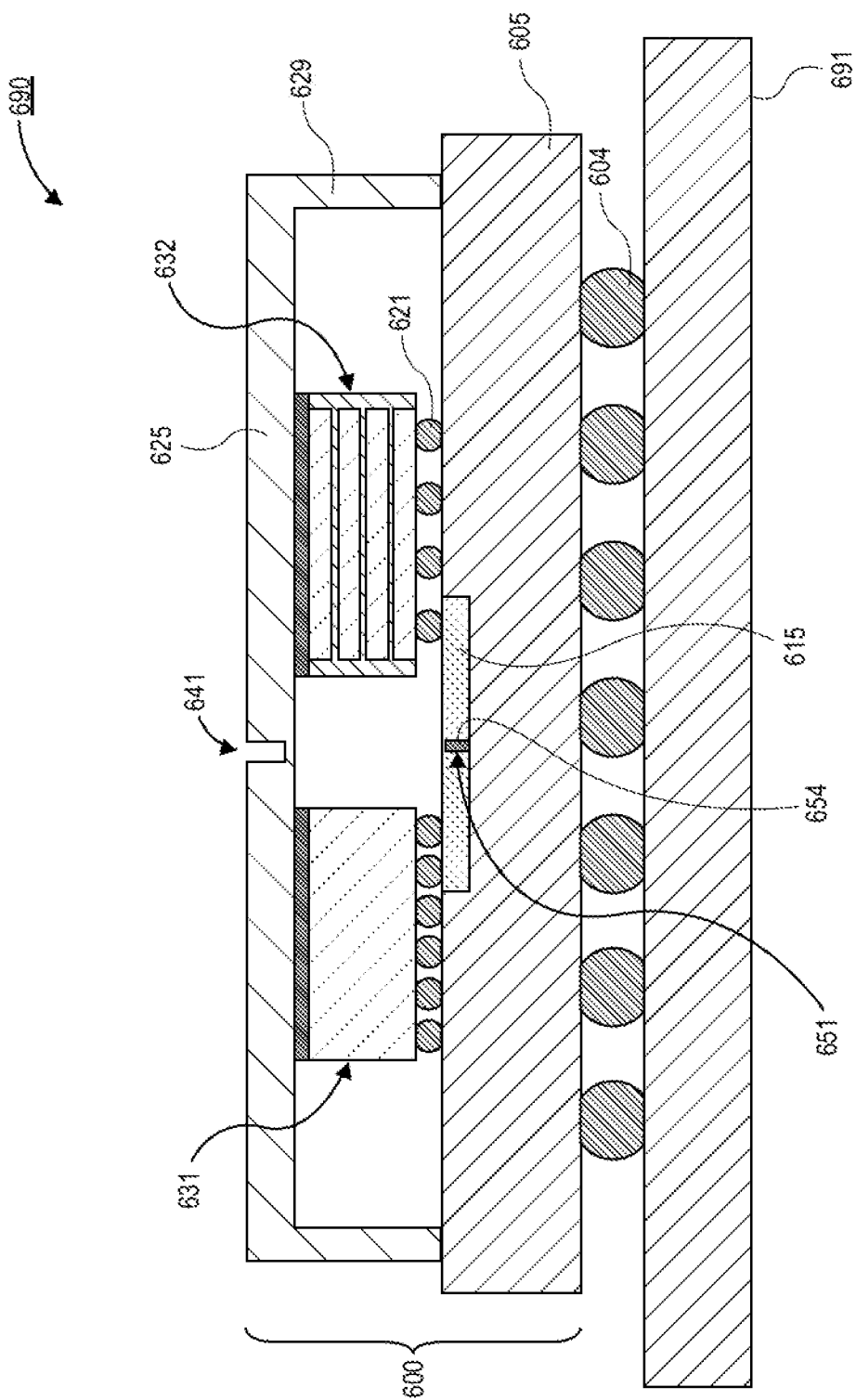

US 11,837,519 B2

HEATSINK CUTOUT AND INSULATING THROUGH SILICON VIAS TO CUT THERMAL CROSS-TALK

TECHNICAL FIELD

Embodiments of the present disclosure relate to semiconductor devices, and more particularly to electronic packages with a thermal break in the heatsink and/or in an interposer in order to thermally isolate a first die from a second die

BACKGROUND

Thermal management of microelectronic packages is becoming an increasingly difficult engineering consideration as the package power and the number of dies in the package increases. For example, client and server microelectronic packages may include a first die and a high bandwidth memory (HBM) module that comprises a plurality of dies. The first die may be a CPU die or a GPU die. The CPU die and the GPU die typically operate at much higher power than the HBM module. For example, a CPU die and a GPU die may operate at approximately 300 W or greater and the HBM module may operate at approximately 15 W.

Furthermore, the CPU die and the GPU die often have a higher junction temperature ($T_j$) than the $T_j$ of the HBM module. For example, the $T_j$ of the CPU die and the GPU die may be approximately 105° C. and the $T_j$ of the HBM module may be approximately 95° C. Accordingly, thermal cross-talk from the CPU die or the GPU die to the HBM module is particularly problematic. That is, excess heat generated by the CPU die or the GPU die may result in the HBM module exceeding its junction temperature and result in throttling, damage, or even failure of the HBM module.

Several solutions have been proposed to mitigate the thermal cross-talk. One such solution is to use liquid cooling. However, liquid cooling is a high cost solution and may also provide additional failure mechanisms (e.g., leakage of the cooling fluid). Liquid cooling solutions also increase the form factor of the microelectronic package, and is not desirable in certain applications where form factor is a constraining factor.

BRIEF DESCRIPTION OF THE DRAWINGS

FIG. 6A is a cross-sectional illustration of an electronic system with a thermal break in a heatsink and an interposer, in accordance with an embodiment.

FIG. 6B is a cross-sectional illustration of an electronic system with a thermal break in a heatsink and an embedded interposer, in accordance with an embodiment.

EMBODIMENTS OF THE PRESENT DISCLOSURE

Described herein are electronic packages with thermal breaks in the heat sink and/or in an interposer in order to thermally isolate a first die from a second die, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, reducing thermal cross-talk between dies in an electronic package is critical for proper operation of the various dies or die modules in advanced electronic packages. Examples, of such thermal cross-talk in various architectures is illustrated with respect to FIGS. 1A and 1B.

Figure 1A:
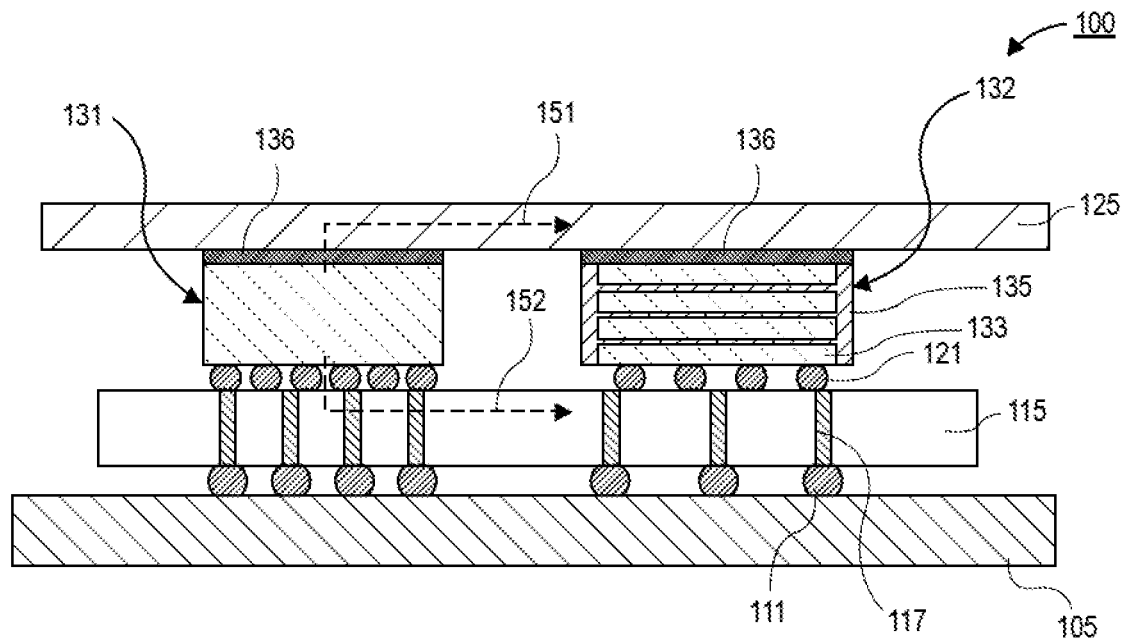
FIG. 1A is a cross-sectional illustration of an electronic package with a first die and a second die on an interposer that illustrates thermal energy propagation from the first die to the second die, in accordance with an embodiment.

Referring now to FIG. 1A, a cross-sectional illustration of an electronic package 100 is shown. The electronic package 100 may comprise a package substrate 105, an interposer 115, a first die 131, a second die 132, and a heatsink 125. The interposer 115 may be attached to the package substrate by interconnects 111. The interconnects 111 may be electrically coupled to the opposite side of the interposer 115 by through interposer vias 117. The first die 131 and the second die 132 may be coupled to the interposer 115 by interconnects 121. The first die 131 may be communicatively coupled to the second die 132 by traces (not shown) on the interposer 115. The first die 131 and the second die 132 may be thermally coupled to the heatsink 125 by a thermal interface material (TIM) 136.

The first die 131 may be a CPU or a GPU. The second die 132 may be a die module that comprises a plurality of discrete dies 133 in a vertical stack. The dies 133 may be embedded in an epoxy 135 or the like. For example, the second die 132 may be a high bandwidth memory (HBM) module. As noted above, the first die 131 may operate at a higher power than the second die 132. Accordingly heat may propagate towards the second die 132. As shown by line 151, thermal energy is propagated from the backside surface of the first die 131 into the heatsink 125 and then towards the second die 132. Similarly, line 152 shows thermal energy propagating from the active surface of the first die 131 into the interposer 115 and towards the second die 132. The propagation of thermal energy from the first die 131 to the second die 132 may result in the junction temperature ($T_j$) of the second die 132 being exceeded.

Figure 1B:
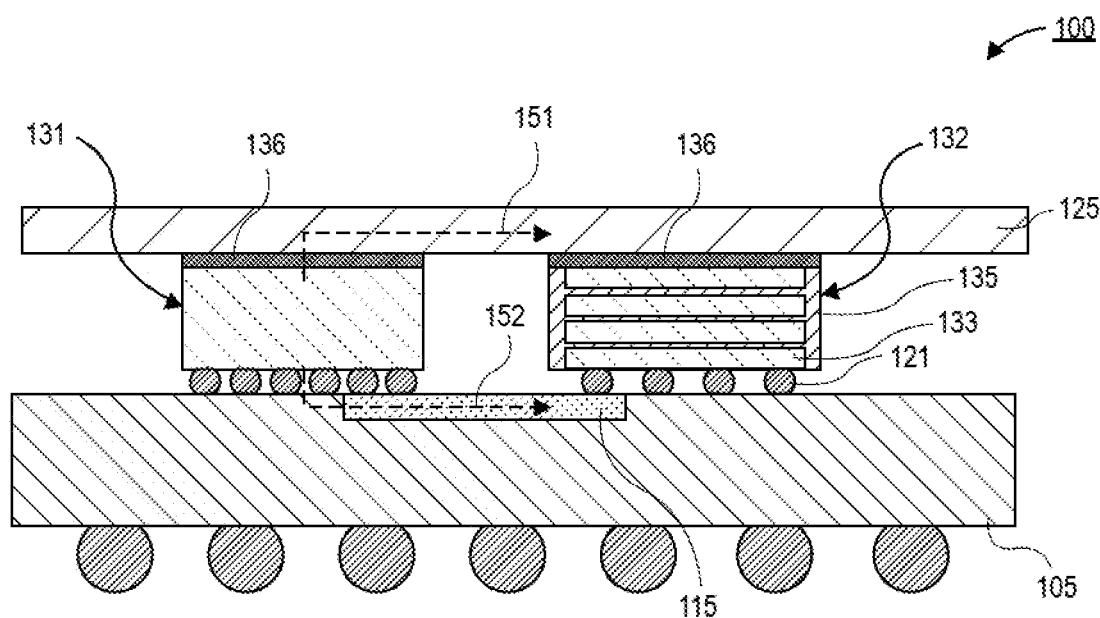
FIG. 1B is a cross-sectional illustration of an electronic package with a first die and a second die connected by an embedded interposer that illustrates thermal energy propagation from the first die to the second die, in accordance with an embodiment.

FIG. 1B is a cross-sectional illustration of an electronic package 100 with a different architecture. As shown, the interposer 115 is embedded in the package substrate 105. Such architectures may sometimes be referred to as an embedded multi-die interconnect bridge (EMIB) architecture, and the interposer 115 may sometimes be referred to as a bridge. Despite the different architecture, the electronic package 100 in FIG. 1B still suffers from thermal cross-talk, as indicated by lines 151 and 152.

Accordingly, embodiments disclosed herein provide thermal breaks within various components in order to mitigate the thermal cross-talk. Particularly, the thermal breaks are positioned between the first die and the second die. This allows for the heat load of each die to be segregated and prevents one or both dies from exceeding the junction temperature $T_j$.

In one embodiment, a thermal break is provided in the heatsink. In another embodiment, a thermal break is provided in the interposer. In yet another embodiment, a thermal break is provided in the heatsink and in the interposer. Embodiments disclosed herein include thermal breaks that comprise one or more trenches into the various components. In some embodiments, the trenches are left unfilled. In other embodiments, the trenches are filled with a thermally insulating material, such as $SiO_2$.

Figure 2A:
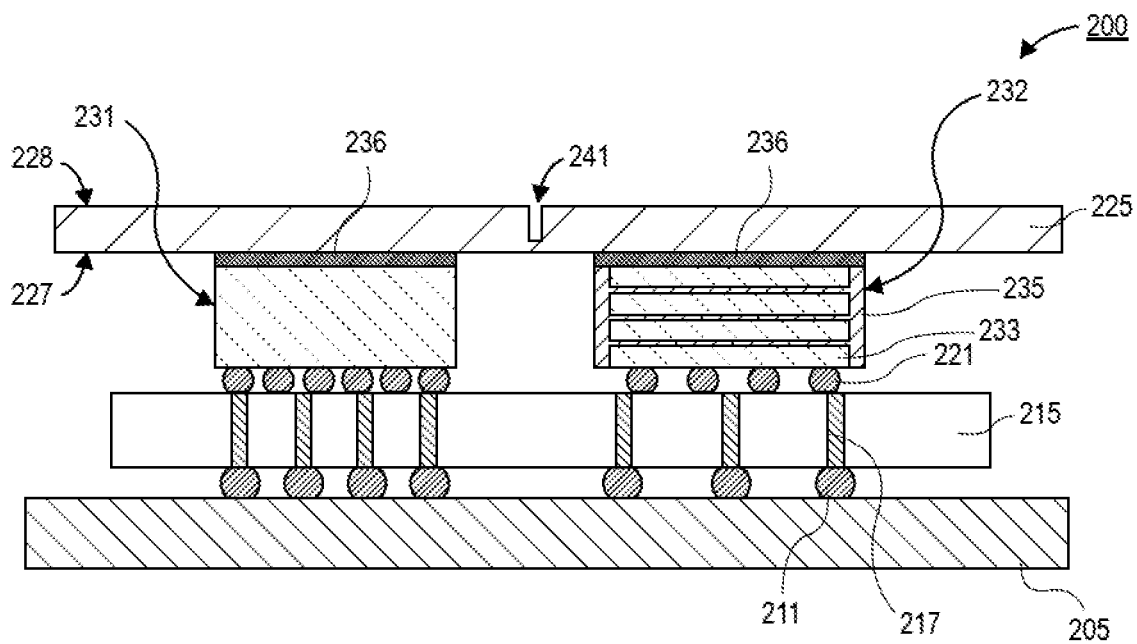
FIG. 2A is a cross-sectional illustration of an electronic package with a first die and a second die on an interposer with a heatsink with a thermal break between the first die and the second die, in accordance with an embodiment.

Referring now to FIG. 2A, a cross-sectional illustration of an electronic package 200 is shown, in accordance with an embodiment. In an embodiment, the electronic package 200 comprises a package substrate 205, an interposer 215, a first die 231, a second die 232, and a heatsink 225.

In an embodiment, the package substrate 205 may be any suitable packaging substrate material. For example, the package substrate 205 may comprise laminated layers of organic material. In some embodiments, the package substrate 205 is a cored substrate. In other embodiments, the package substrate 205 is a coreless package substrate. In an embodiment, conductive features (not shown) may be embedded in the package substrate. For example, traces, pads, vias, etc. may provide electrical connections from a top surface of the package substrate 205 to a bottom surface of the package substrate 205.

In an embodiment, the interposer 215 may be any suitable interposer material. For example, the interposer 215 may comprise silicon, ceramic, glass, or the like. In an embodiment, the interposer 215 may comprise through interposer vias 217. The vias 217 comprise conductive material (e.g., copper) that provides an electrical connection between a top surface and a bottom surface of the interposer 215. The interposer 215 may be attached to the package substrate 205 by interconnects 211. The interconnects 211 may be solder bumps, pillars, or any other suitable interconnect architecture.

In an embodiment, conductive traces (not shown) may be disposed over a top surface of the interposer 215. In some embodiments, the conductive traces may be embedded in a portion of the interposer 215. The conductive traces may be connected to one or more interconnects 221 that interface with the first die 231 and the second die 232. The conductive traces may communicatively couple the first die 231 to the second die 232.

In an embodiment, the first die 231 is a CPU die or a GPU die. While a single first die 231 is shown, it is to be appreciated that the first die 231 may also include a die module. That is, the first die 231 may comprise multiple chiplets that are stacked or otherwise connected together to form a first die module. While the first die 231 is explained herein as a CPU die or a GPU die, it is to be appreciated that the first die 231 may represent any type of semiconductor die.

In an embodiment, the second die 232 may be a different type of die than the first die 231. For example, where the first die 231 is a CPU die or a GPU die, the second die 232 may be a memory die. In a particular embodiment, the second die 232 is a die module. That is, the second die 232 may comprise a plurality of stacked dies 233. The stacked dies 233 may be embedded in an epoxy 235 or the like. In an embodiment, the second die 232 is an HBM module.

In an embodiment, the first die 231 and the second die 232 may both be thermally coupled to a single heatsink 225. For example, a TIM 236 may be disposed between the heatsink 225 and the backside surfaces of the first die 231 and the second die 232. Since the first die 231 and the second die 232 are coupled to the same heatsink 225, thermal cross-talk can potentially cause reliability issues, as described above.

Accordingly, embodiments may include a thermal break between the first die 231 and the second die 232. The thermal break reduces the transfer of thermal energy from a first side of the heatsink 225 (i.e., over the first die 231) to a second side of the heatsink 225 (i.e., over the second die 232). In FIG. 2A, the thermal break is illustrated as a trench 241. In an embodiment, the trench 241 extends into a first surface 228 of the heatsink 225. In some embodiments, the trench 241 may not extend entirely through a thickness of the heatsink 225 to a second surface 227.

The trench 241 is located between the first die 231 and the second die 232. As used herein, reference to the thermal break being "between" the first die 231 and the second die 232 refers to the position of the thermal break (e.g., trench 241) being between the first die 231 and the second die 232 in the X-Y plane. It is to be appreciated that the thermal break may be above one or both the first die 231 and the second die 232 in the Z-direction.

In the illustrated embodiment, the trench 241 is positioned substantially equidistant to an edge of the first die 231 and an edge of the second die 232. In other embodiments, the trench 241 may be located closer to one of the first die 231 and the second die 232. For example, the trench 241 may be positioned closer to an edge of the second die 232 than to an edge of the first die 231.

In an embodiment, the heatsink 225 may be any thermally conductive material. For example, the heatsink 225 may comprise copper, aluminum, stainless steel, nickel, or the like. In an embodiment, the heatsink 225 may comprise a core material that is plated (e.g., a copper core with nickel plating). The heatsink 225 is illustrated as a substantially planar structure. That is, the first surface 228 is shown as being substantially planar to a second surface 227. However, it is to be appreciated that the heatsink 225 may take any form. In some embodiments, the heatsink 225 may be part of an integrated heat spreader (IHS). For example, one or more supports (not shown) may extend down from the second surface 227 to the package substrate 205 or the interposer 215. In some embodiments, the heatsink 225 may be part of a lid of the electronic package 200. In an embodiment, the electronic package 200 may be a bare die electronic package 200 (i.e., the electronic package 200 may not have a lid). In such embodiments, the heatsink 225 may be clamped or otherwise secured against the dies 231 and 232 (e.g., by a frame that is clamped to the package substrate by a fastener).

In the embodiment illustrated in FIG. 2A, the thermal break is shown as being a single trench 241. However, it is to be appreciated that the thermal break may comprise many different configurations. Examples of such thermal breaks are provided in greater detail with respect to FIGS. 2B-2F.

Figure 2B:
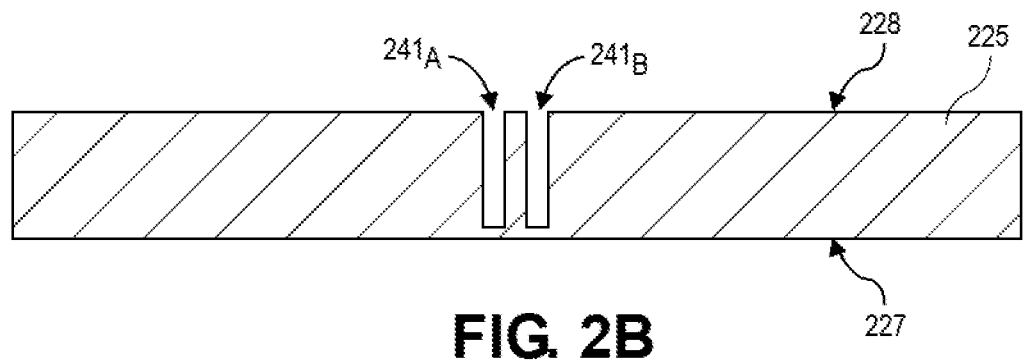
FIG. 2B is a cross-sectional illustration of a heatsink with a thermal break that comprises a pair of trenches, in accordance with an embodiment.

Referring now to FIG. 2B, a cross-sectional illustration of a heatsink 225 is shown, in accordance with an embodiment. The heatsink 225 in FIG. 2B may be used in conjunction with an electronic package 200 similar to the one illustrated and described with respect to FIG. 2A.

In an embodiment, the heatsink 225 in FIG. 2B may be similar to the heatsink 225 in FIG. 2A, with the exception that a plurality of trenches 241 are disposed into the first surface 228. For example, a first trench $241_A$ and a second trench $241_B$ are disposed into the first surface 228. In an embodiment, the first trench $241_A$ and the second trench $241_B$ may be substantially uniform to each other. In other embodiments, the first trench $241_A$ may have a different geometry than the second trench $241_B$. The inclusion of a plurality of trenches $241_A$ and $241_B$ may increase the effectiveness of the thermal break by adding an additional low thermal conductivity barrier (i.e., the air in the second trench $241_B$) that thermal energy needs to propagate past.

Figure 2C:
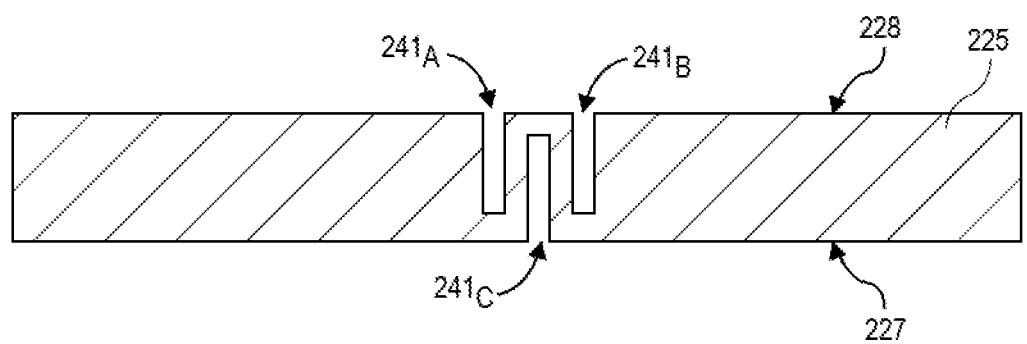
FIG. 2C is a cross-sectional illustration of a heatsink with a thermal break that comprises trenches into a top surface and a bottom surface of the heatsink, in accordance with an embodiment.

Referring now to FIG. 2C, a cross-sectional illustration of a heatsink 225 is shown, in accordance with an embodiment. The heatsink 225 in FIG. 2C may be used in conjunction with an electronic package 200 similar to the one illustrated and described with respect to FIG. 2A.

In an embodiment, the heatsink 225 in FIG. 2C may be similar to the heatsink 225 in FIG. 2B, with the exception that the plurality of trenches 241 further comprises a third trench $241_C$. In an embodiment, the third trench $241_C$ is disposed into the second surface 227 of the heatsink 225. As such, there is a thermal barrier across an entire thickness of the heatsink 225 between the first surface 228 and the second surface 227. In an embodiment, the third trench $241_C$ is positioned between the first trench $241_A$ and the second trench $241_B$. However, it is to be appreciated that the third trench $241_C$ may be positioned at any position along the heatsink 225. In yet another embodiment, the second trench $241_B$ may be omitted. That is, in some embodiments, a single first trench $241_A$ may be disposed into the first surface 228 and a single third trench $241_C$ may be disposed into the second surface 227.

Figure 2D:
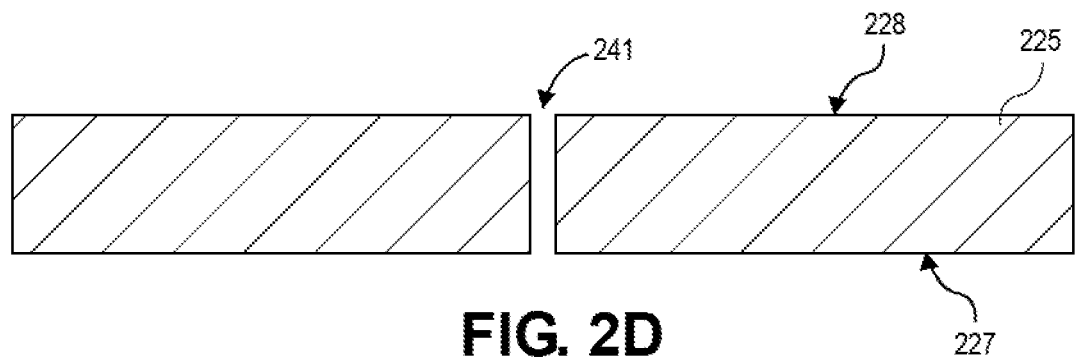
FIG. 2D is a cross-sectional illustration of a heatsink with a thermal break that passes through an entire thickness of the heatsink, in accordance with an embodiment.

Referring now to FIG. 2D, a cross-sectional illustration of a heatsink 225 is shown, in accordance with an embodiment. The heatsink 225 in FIG. 2D may be used in conjunction with an electronic package 200 similar to the one illustrated and described with respect to FIG. 2A.

In an embodiment, the heatsink 225 in FIG. 2D may be similar to the heatsink 225 in FIG. 2A, with the exception that the trench 241 extends through an entire thickness of the heatsink 225 between the first surface 228 and the second surface 227. In such an embodiment, the thermal break may be improved since the high thermal conductivity path below the trench 241 in FIG. 2A is omitted.

In FIG. 2D, the cross-sectional illustration appears to depict that the heatsink 225 is formed of two discrete components (i.e., a left side and a right side). However, it is to be appreciated that the heatsink 225 may still be formed as a single monolithic part, as shown in the plan views in FIGS. 2E and 2F.

Figure 2E:
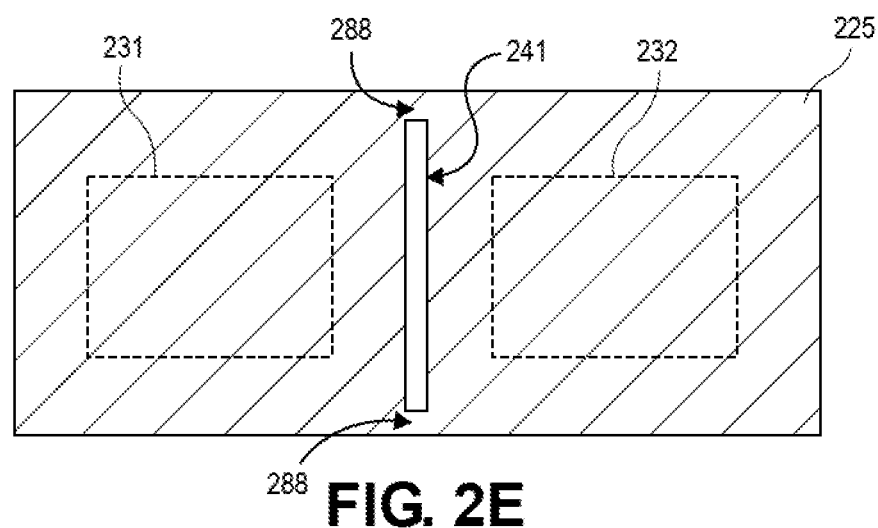
FIG. 2E is a plan view illustration of a heatsink that illustrates a thermal break that is a trench, in accordance with an embodiment.

Referring now to FIG. 2E, a plan view illustration of the heatsink 225 in FIG. 2D is shown, in accordance with an embodiment. The trench 241 may be a substantially linear trench between the first die 231 and the second die 232. The dies 231 and 232 are illustrated with dashed lines to indicate that they are positioned below the heatsink 225. As shown, the left side of the heatsink 225 (over the first die 231) may be attached to the right side of the heatsink 225 (over the second die 232) by bridges 288. Due to the relatively small cross-section of the bridges 288, the propagation of thermal energy across the bridges 288 is reduced.

Figure 2F:
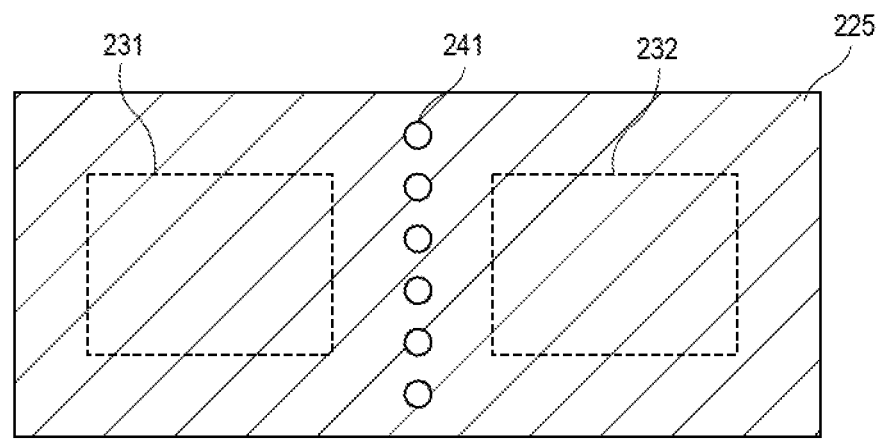
FIG. 2F is a plan view illustration of a heatsink that illustrates a thermal break that is a plurality of holes, in accordance with an embodiment.

Referring now to FIG. 2F, a plan view illustration of the heatsink 225 in FIG. 2D is shown, in accordance with an additional embodiment. As shown, a plurality of trenches 241 (e.g., holes) may be disposed into the heatsink 225 between the first die 231 and the second die 232. Six discrete trenches 241 are shown in FIG. 2F, but it is to be appreciated that any number of trenches 241 may be used. Decreasing the spacing between the trenches 241 increases the efficiency of the thermal break.

Figure 3A:
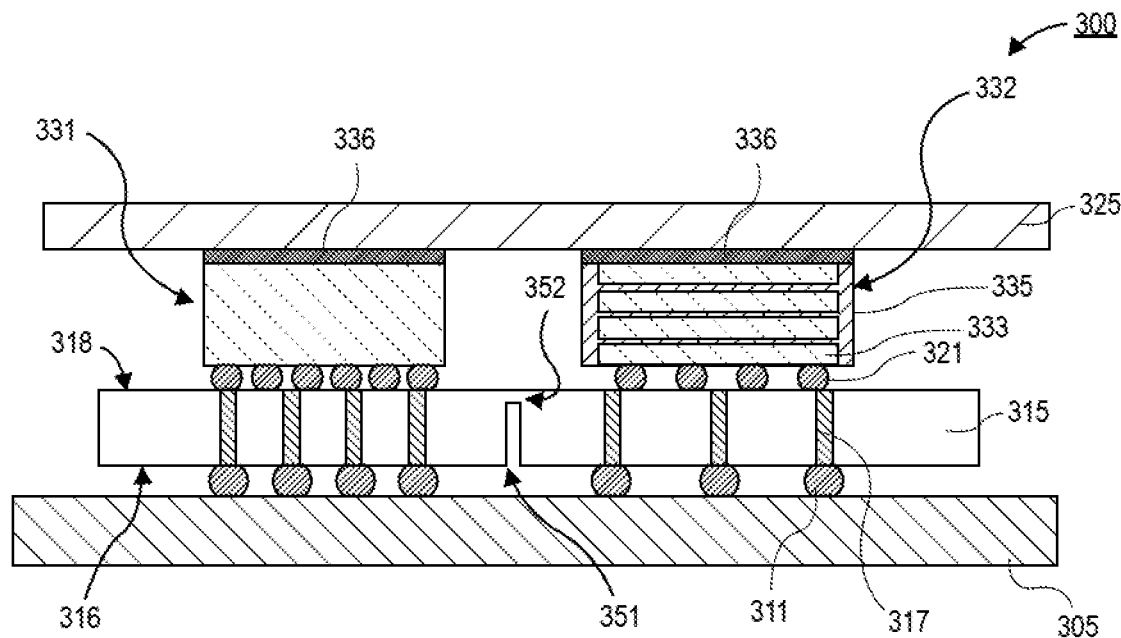
FIG. 3A is a cross-sectional illustration of an electronic package with a first die and a second die on an interposer, where the interposer comprises a thermal break between the first die and the second die, in accordance with an embodiment.

Referring now to FIG. 3A, a cross-sectional illustration of an electronic package 300 is shown, in accordance with an additional embodiment. In an embodiment, the electronic package 300 may comprise a package substrate 305, an interposer 315, a first die 331, a second die 332, and a heatsink 325. The use of an interposer 315 below the first die 331 and the second die 332 may be beneficial to provide improved heat spreading. For example, HBM modules typically suffer from a hotspot at the bottom surface since the HBM stack has a high thermal resistance. That is, the thermal energy may not easily propagate up through the HBM module to the heatsink 325. The interposer 315 provides improved heat spreading due to the lower thermal resistance (compared to organic layers of the package substrate 305). However, the decrease in thermal resistance also leads to an increase in thermal cross-talk between the first die 331 and the second die 332.

Accordingly, embodiments include a thermal break that is disposed in the interposer 315 between the first die 331 and the second die 332. As shown, the thermal break comprises a trench 351. In an embodiment, the trench 351 is disposed into a second surface 316 of the interposer 315. This is beneficial since the first surface 318 may be used for electrical routing between the first die 331 and the second die 332. Since there is no trench opening at the first surface 318 of the interposer 315, the electrical routing does not need to navigate any gaps in the interposer 315 and passes across the bridge 352 over the trench 351.

Aside from moving the thermal break from the heatsink 325 to the interposer 315, the electronic package 300 may be substantially similar to the electronic package 200 in FIG. 2A. For example, the interposer 315 may have through interposer vias 317 that connect to the package substrate 305 by interconnects 311. Interconnects 321 may connect the first surface 318 of the interposer 315 to the first die 331 and the second die 332. In some embodiments, the second die 332 may be a die module (e.g., an HBM module) that includes a plurality of dies 333 that are embedded in an epoxy 335 or the like. The first die 331 and the second die 332 may be thermally coupled to the heatsink 325 by TIM 336.

In the embodiment illustrated in FIG. 3A, the thermal break is shown as being a single trench 351. However, it is to be appreciated that the thermal break may comprise many different configurations. Examples of such thermal breaks are provided in greater detail with respect to FIGS. 3B-3H.

Figure 3B:
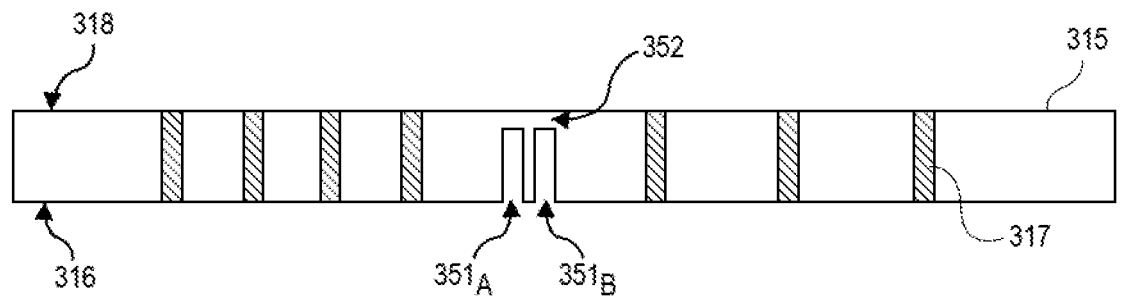
FIG. 3B is a cross-sectional illustration of an interposer with a thermal break that comprises a pair of trenches, in accordance with an embodiment.

Referring now to FIG. 3B, a cross-sectional illustration of an interposer 315 is shown, in accordance with an embodiment. The interposer 315 in FIG. 3B may be used in conjunction with an electronic package 300 similar to the one illustrated and described with respect to FIG. 3A.

In an embodiment, the interposer 315 in FIG. 3B may be similar to the interposer 315 in FIG. 3A, with the exception that a plurality of trenches 351 are disposed into the second surface 316. For example, a first trench $351_A$ and a second trench $351_B$ are disposed into the second surface 316. In an embodiment, the first trench $351_A$ and the second trench $351_B$ may be substantially uniform to each other. In other embodiments, the first trench $351_A$ may have a different geometry than the second trench $351_B$. The inclusion of a plurality of trenches $351_A$ and $351_B$ may increase the effectiveness of the thermal break by adding an additional low thermal conductivity barrier (i.e., the air in the second trench $351_B$) that thermal energy needs to propagate past.

Figure 3C:
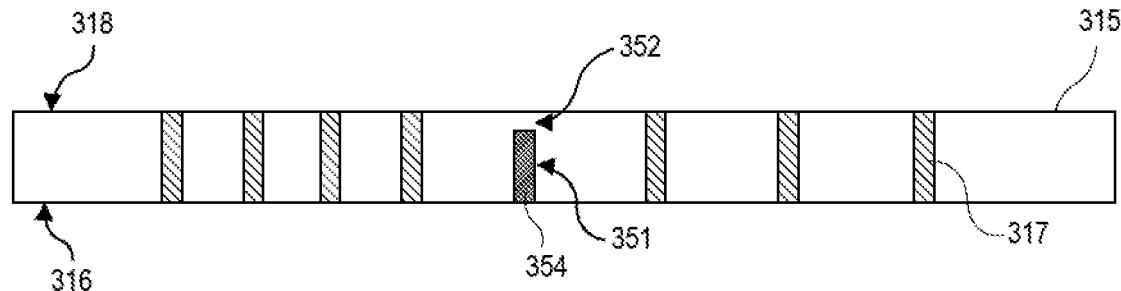
FIG. 3C is a cross-sectional illustration of an interposer with a thermal break that comprises a trench filled with a thermally insulating material, in accordance with an embodiment.

Referring now to FIG. 3C, a cross-sectional illustration of an interposer 315 is shown, in accordance with an embodiment. The interposer 315 in FIG. 3C may be used in conjunction with an electronic package 300 similar to the one illustrated and described with respect to FIG. 3A.

The interposer 315 in FIG. 3C may be substantially similar to the interposer 315 in FIG. 3A, with the exception that the trench 351 is filled with a fill material 354. In an embodiment, the fill material 354 may be any suitable low thermal conductivity material. For example, the fill material 354 may comprise $SiO_2$, a polymer, an epoxy, or the like. In the illustrated embodiment, the fill material 354 completely fills the trench 351. However, it is to be appreciated that in some embodiments, the fill material 354 may not completely fill the trench 351.

Figure 3D:
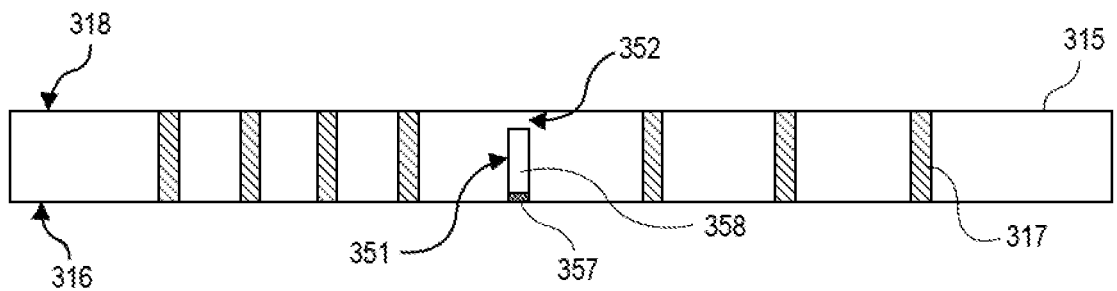
FIG. 3D is a cross-sectional illustration of an interposer with a thermal break that comprises a trench with a lid, in accordance with an embodiment.

Referring now to FIG. 3D, a cross-sectional illustration of an interposer 315 is shown, in accordance with an embodiment. The interposer 315 in FIG. 3D may be used in conjunction with an electronic package 300 similar to the one illustrated and described with respect to FIG. 3A.

The interposer 315 in FIG. 3D may be substantially similar to the interposer 315 in FIG. 3C, with the exception that the fill material only partially fills the trench 351. For example, the fill material forms a lid 357 across the trench 351. This defines an air cavity 358 within the trench.

Figure 3E:
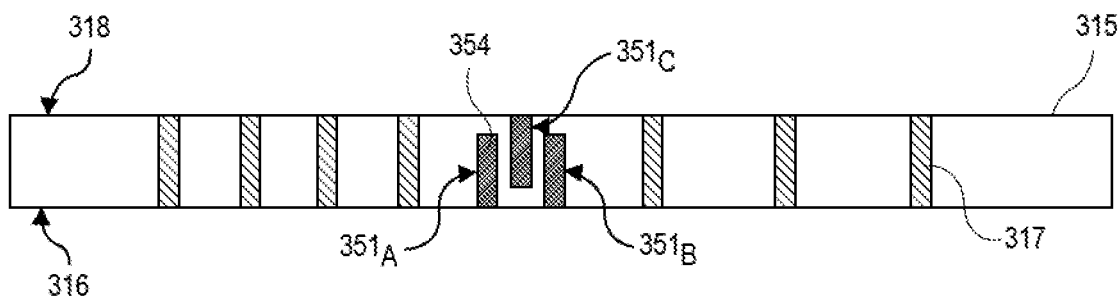
FIG. 3E is a cross-sectional illustration of an interposer with a thermal break that comprises a plurality of trenches into the top surface and bottom surface of the interposer, in accordance with an embodiment.

Referring now to FIG. 3E, a cross-sectional illustration of an interposer 315 is shown, in accordance with an embodiment. The interposer 315 in FIG. 3E may be used in conjunction with an electronic package 300 similar to the one illustrated and described with respect to FIG. 3A.

The interposer 315 in FIG. 3E may be substantially similar to the interposer 315 in FIG. 3B, with the exception that the plurality of trenches 351 further comprises a third trench $351_C$ and the trenches 351 are filled with fill material 354.

In an embodiment, the third trench $351_C$ is disposed into the first surface 318 of the interposer 315. As such, there is a thermal barrier across an entire thickness of the interposer 315 between the first surface 318 and the second surface 316. In an embodiment, the third trench $351_C$ is positioned between the first trench $351_A$ and the second trench $351_B$. However, it is to be appreciated that the third trench $351_C$ may be positioned at any position along the interposer 315. In yet another embodiment, the second trench $351_B$ may be omitted. That is, in some embodiments, a single first trench $351_A$ may be disposed into the second surface 316 and a single third trench $351_C$ may be disposed into the first surface 318. In an embodiment, one or more of the trenches 351 may not be filled with a fill material 354.

Figure 3F:
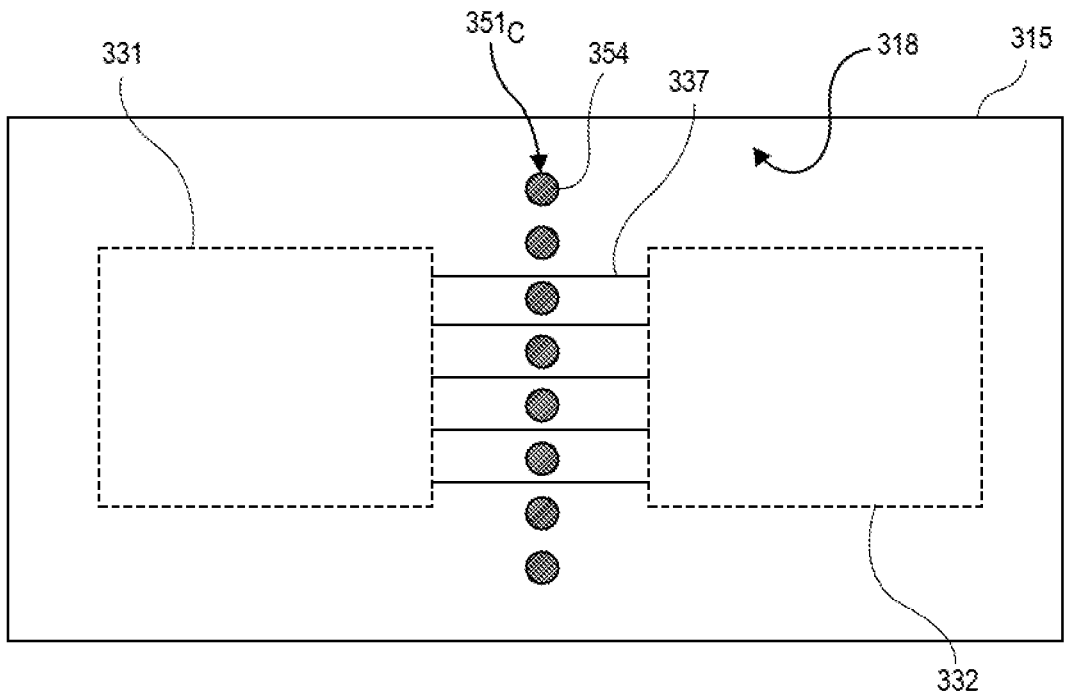
FIG. 3F is a plan view illustration of the top surface of the interposer in FIG. 3E, in accordance with an embodiment.

In order to allow for routing on the first surface 318, the third trenches $351_C$ may not be a continuous line. For example, a plan view illustration of the first surface 318 of a possible arrangement is shown in FIG. 3F. As shown, a plurality of third trenches $351_C$ are disposed into the first surface 318. The third trenches $351_C$ may be referred to as holes in some embodiments. As shown, the spacing between the holes allows for conductive traces 337 to pass across the thermal barrier in order to connect a first die 331 to a second die 332. The first die 331 and the second die 332 are illustrated with dashed lines to indicate that they are above the first surface 318.

Figure 3G:
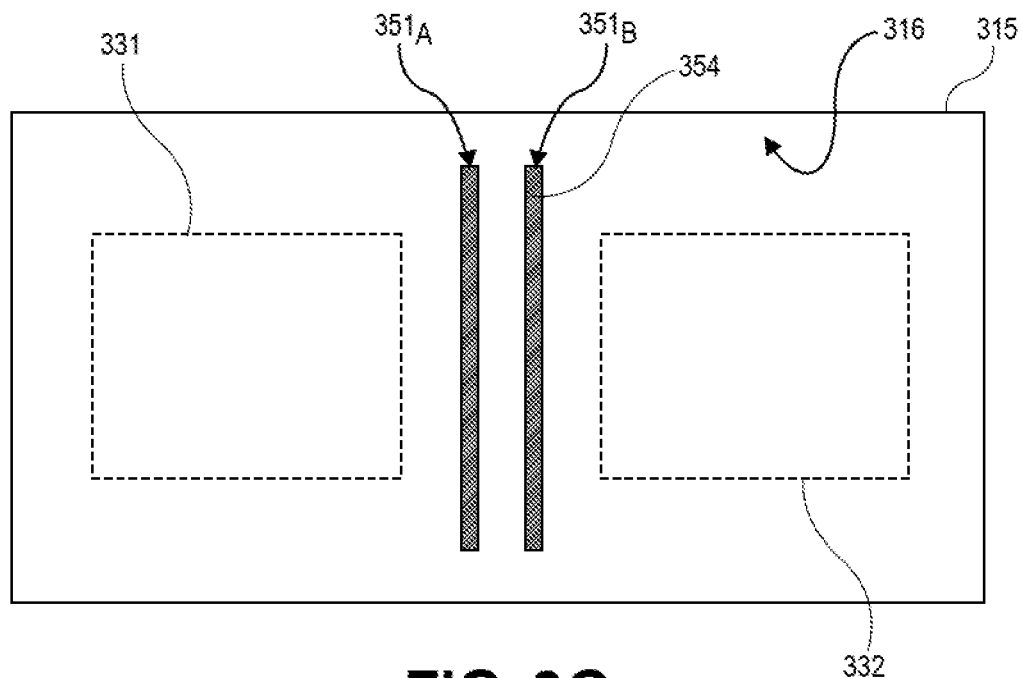
FIG. 3G is a plan view illustration of the bottom surface of the interposer in FIG. 3E, in accordance with an embodiment.

Referring now to FIG. 3G, a plan view illustration of the second surface 316 of the interposer 315 in FIG. 3E is shown, in accordance with an embodiment. As shown, the first trench $351_A$ and the second trench $351_B$ may be linear trenches. This is because there may not need to be any routing over the second surface 316 of the interposer 315.

Figure 3H:
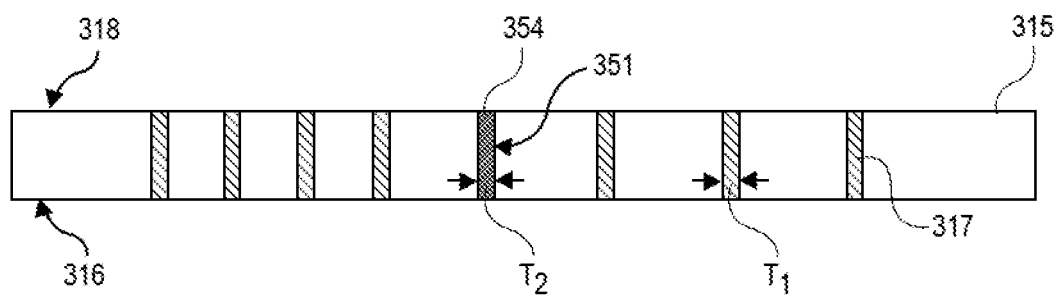
FIG. 3H is a cross-sectional illustration of an interposer with a thermal break that comprises a trench through an entire thickness of the interposer, in accordance with an embodiment.

Referring now to FIG. 3H, a cross-sectional illustration of an interposer 315 is shown, in accordance with an embodiment. The interposer 315 in FIG. 3H may be used in conjunction with an electronic package 300 similar to the one illustrated and described with respect to FIG. 3A.

The interposer 315 in FIG. 3H may be substantially similar to the interposer 315 in FIG. 3C, with the exception that the trench 351 extends through an entire thickness of the interposer 315 from the first surface 318 to the second surface 316. The trench 351 may be filled with a fill material 354 or the trench 351 may not be filled. In an embodiment, the trench 351 through the first surface 318 may be made using a layout similar to the layout in FIG. 3F in order to accommodate routing of conductive traces 337 between the first die 331 and the second die 332. That is, the trench 351 may be referred to as a hole in some embodiments.

In an embodiment, the trench 351 may have substantially the same dimensions as the through interposer vias 317. For example, a first thickness $T_1$ of the vias 317 may be substantially similar to a second thickness $T_2$ of the trench 351. As used herein, a dimension that is "substantially similar" to another dimension may refer to the two dimensions being within 10% of each other. Providing the trench 351 with substantially similar dimensions as the vias 317 allows for a single process to be used to form both structures. The difference between the two being that the vias 317 are filled with a conductive material, and the trench 351 is filled with a thermally insulating material or not filled at all.

Figure 4:
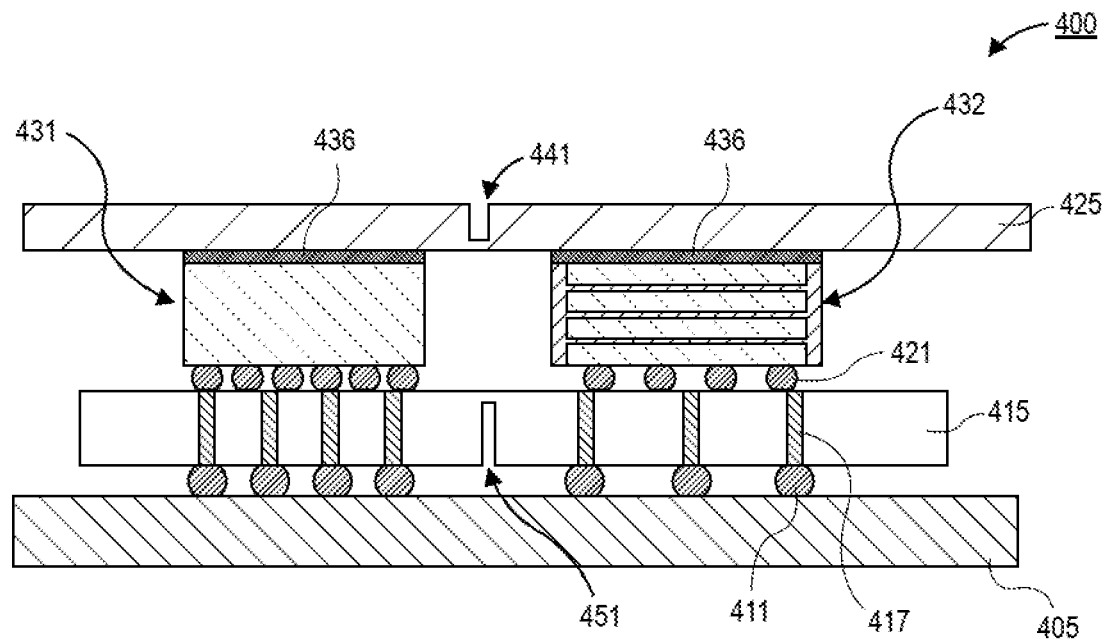
FIG. 4 is a cross-sectional illustration of an electronic package with a first die and a second die on an interposer, where a heatsink and the interposer comprise thermal breaks between the first die and the second die, in accordance with an embodiment.

Referring now to FIG. 4, a cross-sectional illustration of an electronic package 400 is shown, in accordance with an embodiment. The electronic package 400 in FIG. 4 may be substantially similar to the electronic package 300 in FIG. 3A, with the exception that a thermal break is also provided in the heatsink 425. That is, embodiments may include an electronic package 400 with a thermal break in both an interposer 415 and a heatsink 425. In FIG. 4, the thermal break in the interposer 415 is a trench 451 and in the heatsink 425 the thermal break is a trench 441.

In an embodiment, the interposer 415 may include any thermal break architecture, such as those described above. For example, the interposer 415 may have a structure substantially similar to those described above with respect to the interposers 315 in FIGS. 3A-3H. In an embodiment, the heatsink 425 may include any thermal break architecture, such as those described above. For example, the heatsink 425 may have a structure substantially similar to those described above with respect to the heatsinks 225 in FIGS. 2A-2F.

Aside from providing a thermal break in the heatsink 425 and the interposer 415, the electronic package 400 may be substantially similar to the electronic package 300 in FIG. 3A. For example, the interposer 415 may have through interposer vias 417 that connect to the package substrate 405 by interconnects 411. Interconnects 421 may connect the interposer 415 to the first die 431 and the second die 432. In some embodiments, the second die 432 may be a die module (e.g., an HBM module), such as those described above. The first die 431 and the second die 432 may be thermally coupled to the heatsink 425 by TIM 436.

Figure 5A:
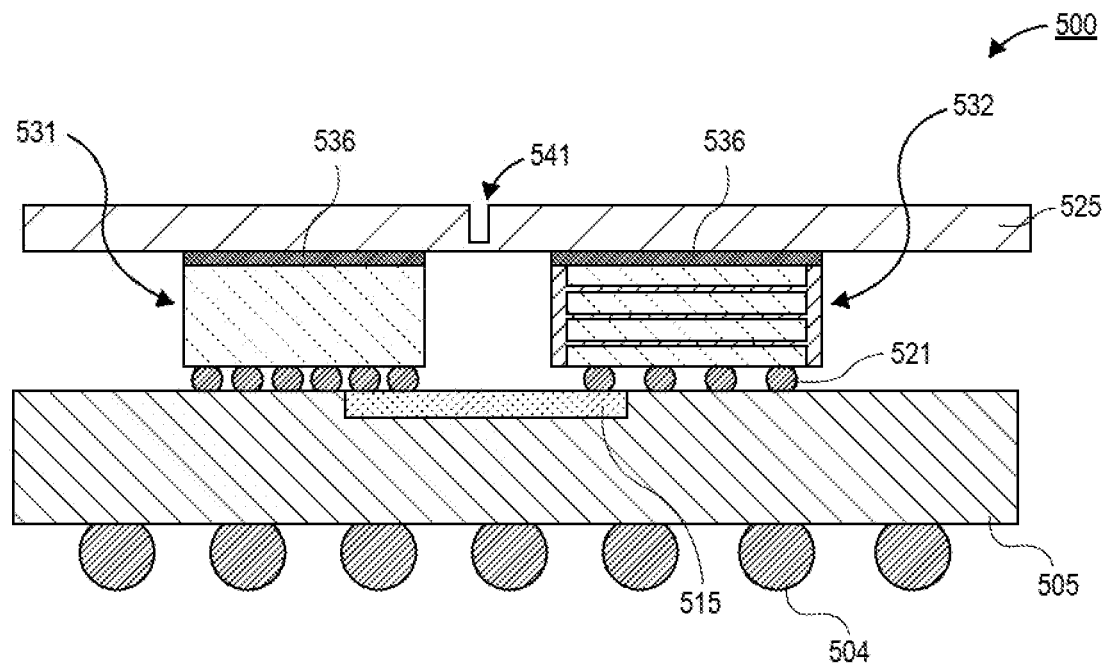
FIG. 5A is a cross-sectional illustration of an electronic package with a first die and a second die on an embedded interposer, where the heatsink comprises a thermal break, in accordance with an embodiment.

Referring now to FIG. 5A, a cross-sectional illustration of an electronic package 500 is shown, in accordance with an additional embodiment. In an embodiment, the electronic package 500 may comprise a package substrate 505, an interposer 515 that is embedded in the package substrate 505, a first die 531, a second die 532, and a heatsink 525. In an embodiment, the interposer 515 may sometimes be referred to as a bridge or a bridge die. Conductive traces (not shown) on the interposer 515 communicatively couples the first die 531 to the second die 532. In an embodiment, the first die 531 and the second die 532 may be over the interposer 515 and over a surface of the package substrate 505. The package substrate 505 may include routing (not shown) to connect interconnects 521 to interconnects 504.

In an embodiment, the first die 531 and the second die 532 may be substantially similar to the first die 231 and the second die 232 in FIG. 2A. For example, the second die 532 may be a die module (e.g., an HBM module). In an embodiment, the first die 531 and the second die 532 may be thermally coupled to the heatsink 525 by TIM 536.

In an embodiment, the heatsink 525 may comprise a thermal break. For example, a trench 541 is disposed into the heatsink 525 between the first die 531 and the second die 532. The heatsink 525 may be substantially similar to any of the heatsinks 225 described above in FIGS. 2A-2F.

Figure 5B:
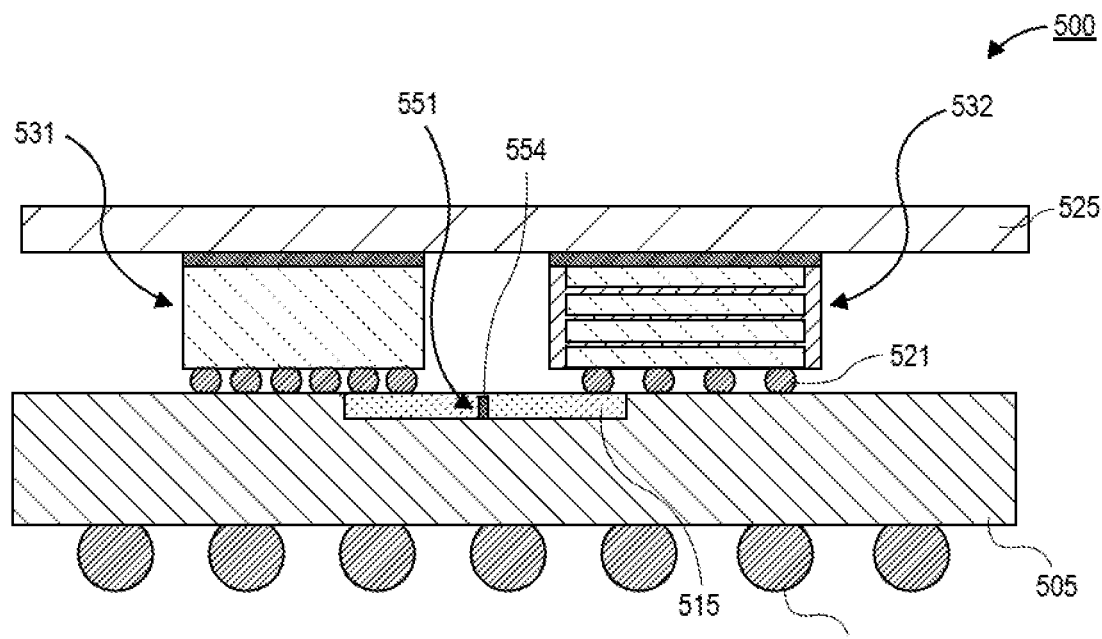
FIG. 5B is a cross-sectional illustration of an electronic package with a first die and a second die on an embedded interposer, where the embedded interposer comprises a thermal break, in accordance with an embodiment.

Referring now to FIG. 5B, a cross-sectional illustration of an electronic package 500 is shown, in accordance with an additional embodiment. The electronic package 500 in FIG. 5B is substantially similar to the electronic package 500 in FIG. 5A, with the exception that the thermal break is moved from the heatsink 525 to the interposer 515. In the illustrated embodiment, the thermal break in the interposer 515 comprises a trench 551 and a fill material 554 in the trench. However, it is to be appreciated that the thermal break in the interposer 515 may have any architecture similar to those described above in FIGS. 3A-3H.

Figure 5C:
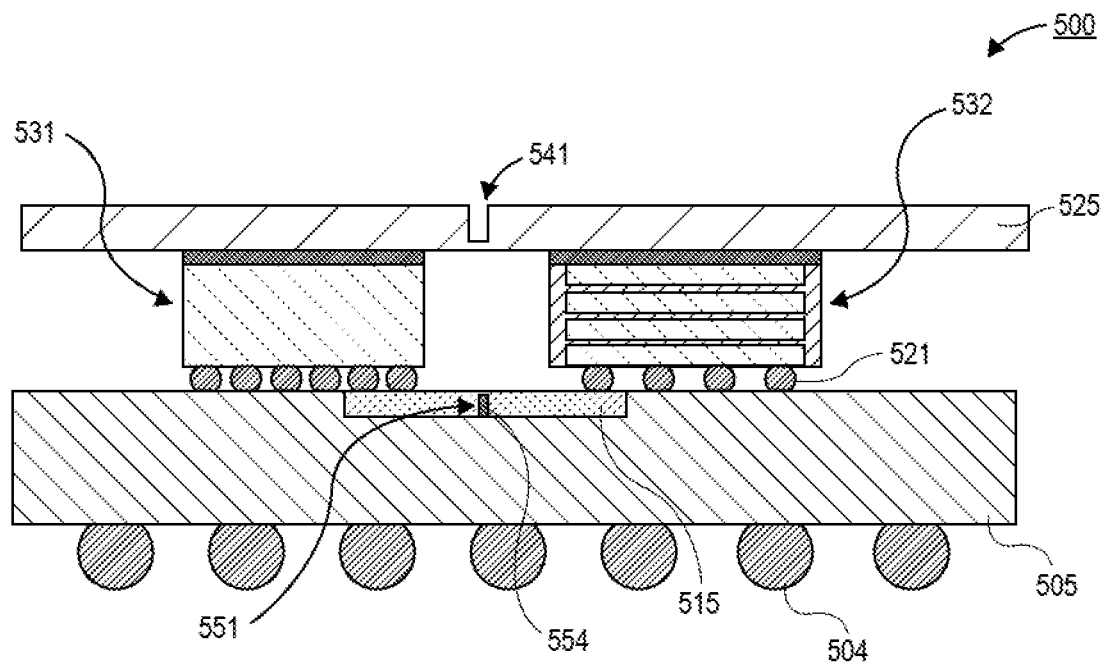
FIG. 5C is a cross-sectional illustration of an electronic package with a first die and a second die on an embedded interposer, where the embedded interposer and a heatsink comprise a thermal break, in accordance with an embodiment.

Referring now to FIG. 5C, a cross-sectional illustration of an electronic package 500 is shown, in accordance with an additional embodiment. The electronic package 500 in FIG. 5C is substantially similar to the electronic package 500 in FIG. 5A, with the addition of a thermal break in the interposer 515. In an embodiment, the interposer 515 may include any thermal break architecture, such as those described above. For example, the interposer 515 may have a structure substantially similar to those described above with respect to the interposers 315 in FIGS. 3A-3H. In an embodiment, the heatsink 525 may include any thermal break architecture, such as those described above. For example, the heatsink 525 may have a structure substantially similar to those described above with respect to the heatsinks 225 in FIGS. 2A-2F.

Referring now to FIG. 6A, a cross-sectional illustration of an electronic system 690 is shown, in accordance with an embodiment. In an embodiment, the electronic system comprises a board 691 and an electronic package 600 attached to the board 691 by interconnects 604. In an embodiment, the interconnects 604 may be solder balls, sockets, wire bonds or any other interconnect architecture.

In an embodiment, the electronic package 600 may comprise a package substrate 605, an interposer 615, a first die 631, a second die 632, and a heatsink 625. The interposer 615 may comprise through interposer vias 617 and be connected to the package substrate by interconnects 611. In an embodiment, interconnects 621 connect the first die 631 and the second die 632 to the interposer 615. In an embodiment, the heatsink 625 may be over the first die 631 and the second die 632. In an embodiment, the heatsink 625 may be part of an IHS. That is, supports 629 may extend down from the heatsink 625 in some embodiments.

In an embodiment, one or both of the interposer 615 and the heatsink 625 may comprise a thermal break between the first die 631 and the second die 632. In the illustrated embodiment, the thermal break in the interposer 615 comprises a trench 651, and the thermal break in the heatsink 625 comprises a trench 641. However, it is to be appreciated that thermal breaks in accordance with embodiments described above may be used in the heatsink 625 and/or the interposer 615.

In the illustrated embodiment, the electronic package 600 is similar to the electronic package 400 in FIG. 4. However, it is to be appreciated that the electronic package 600 may comprise an architecture similar to any of the electronic packages described above with respect to FIG. 2A-2F or 3A-3H.

Referring now to FIG. 6B, a cross-sectional illustration of an electronic system 690 is shown, in accordance with an additional embodiment. In an embodiment, the electronic system 690 in FIG. 6B may be similar to the electronic system 690 in FIG. 6A, with the exception that the interposer 615 is embedded in the package substrate 605. That is the electronic package 600 may be similar to any of the electronic packages 500 described above with respect to FIGS. 5A-5C. For example, the illustrated thermal break in the interposer 615 comprises a trench 651 that is filled with a fill material 654.

Figure 7:
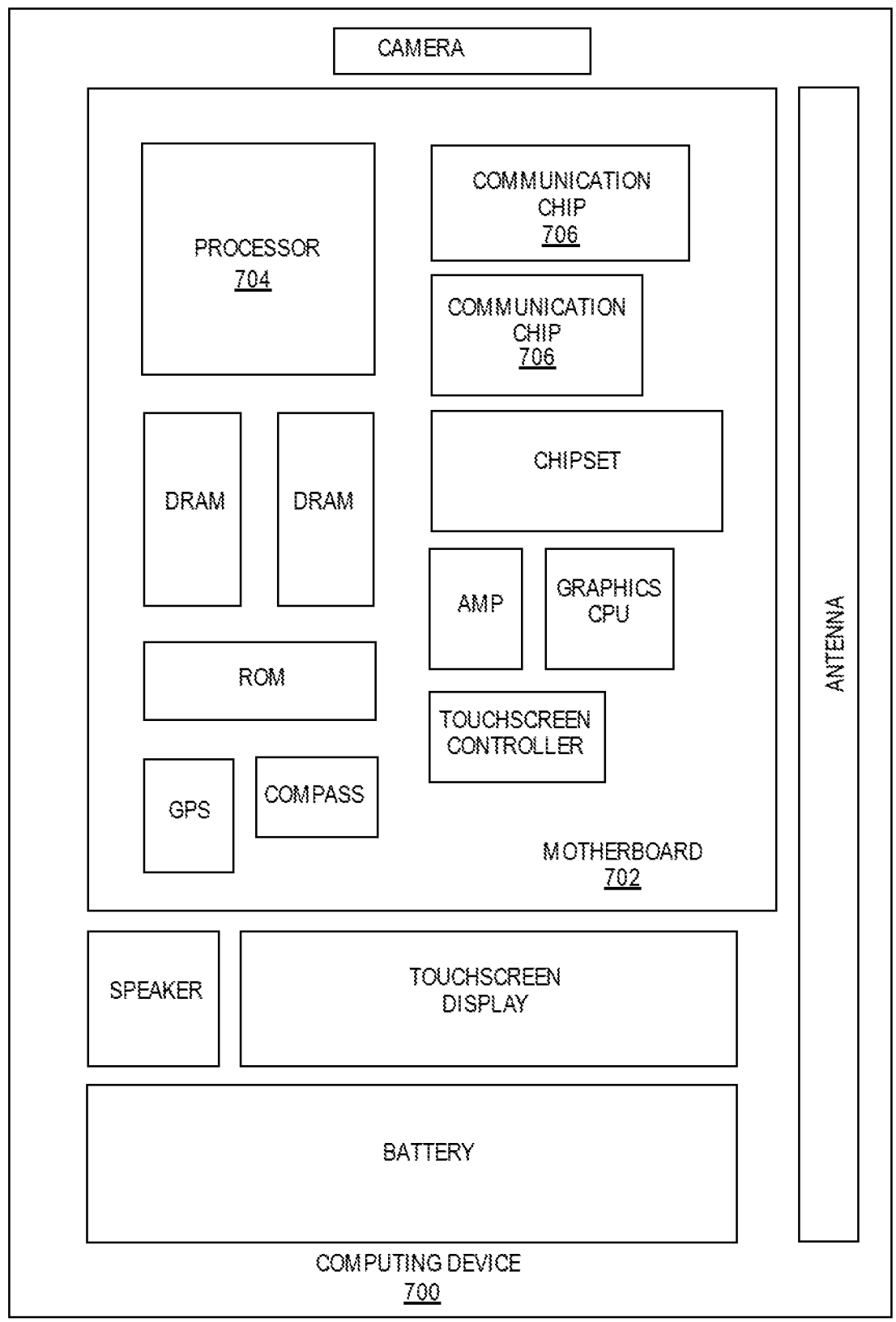
FIG. 7 is a schematic of a computing device built in accordance with an embodiment.

FIG. 7 illustrates a computing device 700 in accordance with one implementation of the invention. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. In some implementations of the invention, the integrated circuit die of the processor 704 may be part of an electronic package that comprises an interposer and/or a heatsink that comprises a thermal break, in accordance with embodiments described herein. The term "processor" may refer to any device or portion of a device that processes electronic data from registers and/or memory to transform that electronic data into other electronic data that may be stored in registers and/or memory.

The communication chip 706 also includes an integrated circuit die packaged within the communication chip 706. In accordance with another implementation of the invention, the integrated circuit die of the communication chip 706 may be part of an electronic package that comprises an interposer and/or a heatsink that comprises a thermal break, with the support thermally coupled to a package substrate, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: an electronic package, comprising: an interposer; a first die attached to the interposer; a second die attached to the interposer; and a heatsink thermally coupled to the first die and the second die, wherein the heatsink has a first surface facing away from the first die and the second die and a second surface facing the first die and the second die, and wherein the heatsink comprises: a thermal break between the first die and the second die.

Example 2: the electronic package of Example 1, wherein the thermal break comprises a trench into the heatsink.

Example 3: the electronic package of Example 2, wherein the trench is disposed into the first surface.

Example 4: the electronic package of Example 2, wherein the trench is disposed into the second surface.

Example 5: the electronic package of Example 2, wherein the trench passes through an entire thickness of the heatsink.

Example 6: the electronic package of Examples 1-4, wherein the thermal break comprises a plurality of trenches, wherein the plurality of trenches comprises a first trench and a second trench.

Example 7: the electronic package of Example 6, wherein the first trench and the second trench are both disposed into the first surface of the heatsink, or wherein the first trench and the second trench are both disposed into the second surface.

Example 8: the electronic package of Example 6, wherein the first trench is disposed into the first surface, and the second trench is disposed into the second surface.

Example 9: the electronic package of Examples 1-8, wherein the thermal break comprises a plurality of holes disposed into the heatsink.

Example 10: the electronic package of Examples 1-9, wherein the interposer is embedded in a package substrate.

Example 11: an electronic package, comprising: an interposer with a first surface and a second surface opposite from the first surface; a first die attached to the first surface of the interposer; and a second die attached to the first surface of the interposer, wherein the first die is communicatively coupled to the second die by a trace on the interposer, and wherein the interposer comprises a thermal break between the first die and the second die.

Example 12: the electronic package of Example 11, wherein the thermal break comprises: a trench into the interposer.

Example 13: the electronic package of Example 12, wherein the trench is disposed into the first surface or into the second surface.

Example 14: the electronic package of Example 12, wherein the trench passes through an entire thickness of the interposer.

Example 15: the electronic package of Example 12, wherein the trench is at least partially filled with a fill material, wherein the fill material is a thermally insulating material.

Example 16: the electronic package of Examples 11-15, wherein the thermal break comprises a plurality of trenches, wherein the plurality of trenches comprises a first trench and a second trench.

Example 17: the electronic package of Examples 11-16, wherein the thermal break comprises a plurality of holes into the interposer, and wherein the trace passes between a pair of holes of the plurality of holes.

Example 18: the electronic package of Examples 11-17, wherein the interposer is embedded in a package substrate.

Example 19: an electronic package, comprising: a first die; a second die laterally adjacent to the first die; an interposer, wherein the first die and the second die are over the interposer; and a heatsink over the first die and the second die, wherein the interposer or the heatsink, or the interposer and the heatsink, comprise: a trench, wherein the trench is located between a first edge of the first die and a second edge of the second die.

Example 20: the electronic package of Example 19, wherein the first die is a processor die, and wherein the second die is a high bandwidth memory (HBM) module.

Example 21: the electronic package of Example 19 or Example 20, wherein the interposer is embedded in a package substrate, and wherein the first die and the second die are both over the package substrate.

Example 22: the electronic package of Example 19 or Example 20, wherein the interposer is attached to a package substrate, wherein the interposer is between the first die and a surface of the package substrate.

Example 23: an electronic system, comprising: a board; a package substrate attached to the board; an interposer attached to the package substrate; a first die over the interposer; a second die over the interposer; and a heatsink over the first die and the second die, wherein the interposer or the heatsink, or the interposer and the heatsink, comprise: a trench, wherein the trench is located between a first edge of the first die and a second edge of the second die.

Example 24: the electronic system of Example 23, wherein the heatsink is an integrated heat spreader.

Example 25: the electronic system of Example 23 or Example 24, wherein the interposer is embedded in the package substrate.

What is claimed is:

1. An electronic package, comprising:
   an interposer;
   a first die attached to the interposer;
   a second die attached to the interposer; and
   a heatsink thermally coupled to the first die and the second die, wherein the heatsink has a first surface facing away from the first die and the second die and a second surface facing the first die and the second die, and wherein the heatsink comprises:
   a thermal break vertically overlapping with a space between the first die and the second die, the space having a lateral width greater than a lateral width of the thermal break.

2. The electronic package of claim 1, wherein the thermal break comprises a trench into the heatsink.

3. The electronic package of claim 2, wherein the trench is disposed into the first surface.

4. The electronic package of claim 2, wherein the trench is disposed into the second surface.

5. The electronic package of claim 2, wherein the trench passes through an entire thickness of the heatsink.

6. The electronic package of claim 1, wherein the thermal break comprises a plurality of trenches, wherein the plurality of trenches comprises a first trench and a second trench.

7. The electronic package of claim 6, wherein the first trench and the second trench are both disposed into the first surface of the heatsink, or wherein the first trench and the second trench are both disposed into the second surface.

8. The electronic package of claim 6, wherein the first trench is disposed into the first surface, and the second trench is disposed into the second surface.

9. The electronic package of claim 1, wherein the thermal break comprises a plurality of holes disposed into the heatsink.

10. The electronic package of claim 1, wherein the interposer is embedded in a package substrate.

11. An electronic package, comprising:
    an interposer with a first surface and a second surface opposite from the first surface;
    a first die attached to the first surface of the interposer; and
    a second die attached to the first surface of the interposer, wherein the first die is communicatively coupled to the second die by a trace on the interposer, and wherein the interposer comprises a thermal break vertically overlapping with a space between the first die and the second die, the space having a lateral width greater than a lateral width of the thermal break.

12. The electronic package of claim 11, wherein the thermal break comprises:
    a trench into the interposer.

13. The electronic package of claim 12, wherein the trench is disposed into the first surface or into the second surface.

14. The electronic package of claim 12, wherein the trench passes through an entire thickness of the interposer.

15. The electronic package of claim 12, wherein the trench is at least partially filled with a fill material, wherein the fill material is a thermally insulating material.

16. The electronic package of claim 11, wherein the thermal break comprises a plurality of trenches, wherein the plurality of trenches comprises a first trench and a second trench.

17. The electronic package of claim 11, wherein the thermal break comprises a plurality of holes into the interposer, and wherein the trace passes between a pair of holes of the plurality of holes.

18. The electronic package of claim 11, wherein the interposer is embedded in a package substrate.

19. An electronic package, comprising:
    a first die;
    a second die laterally adjacent to the first die;
    an interposer, wherein the first die and the second die are over the interposer; and a heatsink over the first die and the second die, wherein the interposer or the heatsink, or the interposer and the heatsink, comprise:
    a trench, wherein the trench is vertically overlapping with a space between a first edge of the first die and a second edge of the second die, the space having a lateral width greater than a lateral width of the trench.

20. The electronic package of claim 19, wherein the first die is a processor die, and wherein the second die is a high bandwidth memory (HBM) module.

21. The electronic package of claim 19, wherein the interposer is embedded in a package substrate, and wherein the first die and the second die are both over the package substrate.

22. The electronic package of claim 19, wherein the interposer is attached to a package substrate, wherein the interposer is between the first die and a surface of the package substrate.

23. An electronic system, comprising:
a board;
a package substrate attached to the board;
an interposer attached to the package substrate;
a first die over the interposer;
a second die over the interposer; and
a heatsink over the first die and the second die, wherein the interposer or the heatsink, or the interposer and the heatsink, comprise:
    a trench, wherein the trench is vertically overlapping with a space between a first edge of the first die and a second edge of the second die, the space having a lateral width greater than a lateral width of the trench.

24. The electronic system of claim 23, wherein the heatsink is an integrated heat spreader.

25. The electronic system of claim 23, wherein the interposer is embedded in the package substrate.

\* \* \* \* \*